(12) United States Patent
Hashi

(10) Patent No.: US 9,342,269 B2
(45) Date of Patent: May 17, 2016

(54) QUANTUM INTERFERENCE UNIT, QUANTUM INTERFERENCE DEVICE, ATOMIC OSCILLATOR, ELECTRONIC APPARATUS, AND MOVING OBJECT

(71) Applicant: Seiko Epson Corporation, Tokyo (JP)

(72) Inventor: Yukihiro Hashi, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/606,327

(22) Filed: Jan. 27, 2015

(65) Prior Publication Data

US 2015/0214895 A1 Jul. 30, 2015

(30) Foreign Application Priority Data

Jan. 28, 2014 (JP) ................. 2014-013818

(51) Int. Cl.
*H03B 17/00* (2006.01)
*H03L 7/26* (2006.01)
*H03L 1/04* (2006.01)
*G06F 5/14* (2006.01)
*H03B 1/04* (2006.01)

(52) U.S. Cl.
CPC .. *G06F 5/14* (2013.01); *H03B 1/04* (2013.01); *H03B 17/00* (2013.01); *H03L 7/26* (2013.01)

(58) Field of Classification Search
CPC ........... G06F 5/14; G06F 5/145; H03B 17/00; H03L 1/04; H03L 7/26
USPC ......................... 331/3, 68–70, 94.1
See application file for complete search history.

(56) References Cited

U.S. PATENT DOCUMENTS

| | | | | |
|---|---|---|---|---|
| 3,382,452 A * | 5/1968 | Rempel | ..................... | H03L 7/26 331/3 |
| 6,133,800 A * | 10/2000 | Deng | ........................ | G04F 5/14 331/3 |
| 6,587,008 B2 * | 7/2003 | Hatanaka | ................. | H03B 5/32 257/758 |
| 6,778,029 B2 * | 8/2004 | Mizusawa | ................ | H03B 5/36 310/348 |
| 7,215,213 B2 * | 5/2007 | Mescher | ............... | B81B 7/0012 331/94.1 |
| 2007/0247241 A1 * | 10/2007 | Braun | ....................... | G04F 5/14 331/94.1 |
| 2012/0256695 A1 * | 10/2012 | Kuroda | .................... | H03H 9/19 331/68 |
| 2012/0313717 A1 | 12/2012 | Ridley et al. | | |
| 2014/0076602 A1 * | 3/2014 | Schober | .................... | G04F 5/14 174/50.5 |

FOREIGN PATENT DOCUMENTS

| JP | 02-210887 | 8/1990 |
|---|---|---|
| JP | 2010-287937 A | 12/2010 |
| JP | 2012-191523 A | 10/2012 |
| JP | 2013-003139 A | 1/2013 |

* cited by examiner

*Primary Examiner* — Levi Gannon
(74) *Attorney, Agent, or Firm* — Harness, Dickey & Pierce, P.L.C.

(57) ABSTRACT

An atomic oscillator includes: a gas cell which houses metal atoms; a heater which adjusts a temperature of the gas cell; and a package which houses the gas cell and the heater. The package includes a non-magnetic metal layer.

16 Claims, 7 Drawing Sheets

QUANTUM INTERFERENCE UNIT, QUANTUM INTERFERENCE DEVICE, ATOMIC OSCILLATOR, ELECTRONIC APPARATUS, AND MOVING OBJECT

BACKGROUND

1. Technical Field

The present invention relates to a quantum interference unit, a quantum interference device, an atomic oscillator, an electronic apparatus, and a moving object.

2. Related Art

An atomic oscillator which oscillates on the basis of energy transition of atoms of an alkali metal such as rubidium or cesium is known. Generally, the operating principles of atomic oscillators are roughly divided into a system utilizing double resonance of light and microwaves and a system utilizing a quantum interference effect (CPT (coherence population trapping)) of two lights with different wavelengths.

In an atomic oscillator of either system, an alkali metal is enclosed in a gas cell, and the gas cell needs to be heated to a predetermined temperature in order to maintain the alkali metal in a gaseous state. Also, in general, the gas cell is housed in an airtightly sealed package, and a coil for applying a steady magnetic field to the alkali metal inside the gas cell is provided for the purpose of improving the oscillation.

For example, the atomic oscillator according to JP-A-2012-191523 has a package formed of a base material of kovar that is Ni-plated on the surface. The atomic oscillator according to JP-A-2013-3139 has a package formed of a non-magnetic ceramic.

However, in the atomic oscillator according to JP-A-2012-191523, since the package is formed with a ferromagnetic material, the package is magnetized by the magnetic fields from the coil and from the outside. Therefore, the magnetic field acting on the alkali metal in the gas cell changes which causes a problem of frequency stability deterioration. Meanwhile, since the package is non-magnetic in the atomic oscillator according to JP-A-2013-3139, the foregoing problem does not occur. However, since the ceramic has a high radiation heat absorptance, a great amount of heat escapes to the outside from inside the package which causes a problem of increased power consumption.

SUMMARY

An advantage of some aspects of the invention is to provide a quantum interference unit, a quantum interference device and an atomic oscillator in which power saving can be achieved and in which a change in characteristics caused by a magnetic field due to magnetization of the package can be prevented or reduced. Another advantage of some other aspects of the invention is to provide an electronic apparatus and a moving object which have such a quantum interference device and are highly reliable.

The invention can be implemented as the following forms or application examples.

Application Example 1

This application example of the invention is directed to a quantum interference unit including: a gas cell which houses metal atoms; a temperature adjustment element which adjusts temperature of the gas cell; and a package which houses the gas cell and the temperature adjustment element and includes a non-magnetic metal layer.

According to such a quantum interference unit, since the package includes a non-magnetic metal material, a change in characteristics caused by a magnetic field due to magnetization of the package can be prevented or reduced. Also, since the metal layer has a low heat absorptance, power saving can be achieved as well.

Application Example 2

It is preferable that the quantum interference unit according to the application example of the invention includes a coil which is arranged on the outside of the package and which applies a magnetic field to the metal atoms.

According to this configuration, the magnetic field from the coil can be made to act on the metal atoms in the gas cell to improve characteristics. Here, since the package is non-magnetic, the magnetic field from the coil can be made to act on the metal atoms in the gas cell even though the coil is arranged on the outside of the package. Also, as the coil is arranged on the outside of the package, the volume within the package can be reduced and consequently miniaturization of the quantum interference unit can be achieved. Moreover, the reduction in the volume within the package enables enhancement of reliability when the inside of the package is vacuum-sealed.

Application Example 3

It is preferable that the quantum interference unit according to the application example of the invention includes a magnetic shield which houses the package and the coil.

According to this configuration, the influence of an external magnetic field on the gas cell can be reduced. Consequently, stabilization of characteristics of the quantum interference unit can be achieved.

Application Example 4

In the quantum interference unit according to the application example of the invention, it is preferable that a pressure inside the package is reduced below atmospheric pressure.

According to this configuration, heat interference between the inside and the outside of the package can be reduced. Consequently, further miniaturization and power saving of the quantum interference unit can be achieved.

Application Example 5

In the quantum interference unit according to the application example of the invention, it is preferable that the package is sealed using a brazing material.

According to this configuration, the package can be sealed airtightly at a relatively low temperature. Therefore, even if the package contains a material that can change into a magnetic material at a high temperature, such change can be prevented.

Application Example 6

In the quantum interference unit according to the application example of the invention, it is preferable that a melting point of the brazing material is below 300° C.

According to this configuration, even if the package contains phosphorus-added nickel as a material that can change into a magnetic material at a high temperature, such change can be prevented.

Application Example 7

In the quantum interference unit according to the application example of the invention, it is preferable that the brazing material contains gold and tin.

According to this configuration, the melting point of the brazing material below 300° C. can be achieved.

Application Example 8

In the quantum interference unit according to the application example of the invention, it is preferable that the package has a coating layer formed with a different material from the metal layer.

According to this configuration, when the package is sealed, even if the metal layer has poor wettability to the brazing material, the coating layer has excellent wettability to the brazing material, enabling easy and secure airtight sealing.

Application Example 9

In the quantum interference unit according to the application example of the invention, it is preferable that the coating layer contains a non-magnetic metal.

According to this configuration, change in characteristics due to magnetization of the coating layer can be reduced.

Application Example 10

In the quantum interference unit according to the application example of the invention, it is preferable that the coating layer contains phosphorus.

According to this configuration, the coating layer can be formed with a non-magnetic metal.

Application Example 11

In the quantum interference unit according to the application example of the invention, it is preferable that a content of phosphorus in the coating layer is 8% by weight or higher.

According to this configuration, the coating layer can be formed with a non-magnetic metal.

Application Example 12

In the quantum interference unit according to the application example of the invention, it is preferable that the coating layer contains palladium.

According to this configuration, the coating layer can be formed with a non-magnetic metal.

Application Example 13

This application example of the invention is directed to a quantum interference device including the quantum interference unit according to the application example of the invention.

According to this configuration, power saving can be achieved and change in characteristics caused by a magnetic field due to magnetization of the package can be prevented or reduced.

Application Example 14

This application example of the invention is directed to an atomic oscillator including the quantum interference unit according to the application example of the invention.

According to this configuration, power saving can be achieved and change in characteristics caused by a magnetic field due to magnetization of the package can be prevented or reduced.

Application Example 15

This application example of the invention is directed to an electronic apparatus including the quantum interference unit according to the application example of the invention.

According to this configuration, an electronic apparatus with excellent reliability can be provided.

Application Example 16

This application example of the invention is directed to a moving object including the quantum interference unit according to the application example of the invention.

According to this configuration, a moving object with excellent reliability can be provided.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, a quantum interference unit, a quantum interference device, an atomic oscillator, an electronic apparatus and a moving object according to the invention will be described in detail, on the basis of an embodiment shown in the accompanying drawings.

1. Atomic Oscillator (Quantum Interference Device)

First, an atomic oscillator (quantum interference device) will be described. While an example in which a quantum interference device is applied to an atomic oscillator will be described below, the quantum interference device is not limited to this example and can be applied to, for example, a magnetic sensor, quantum memory or the like, as well as an atomic oscillator.

Figure 1:
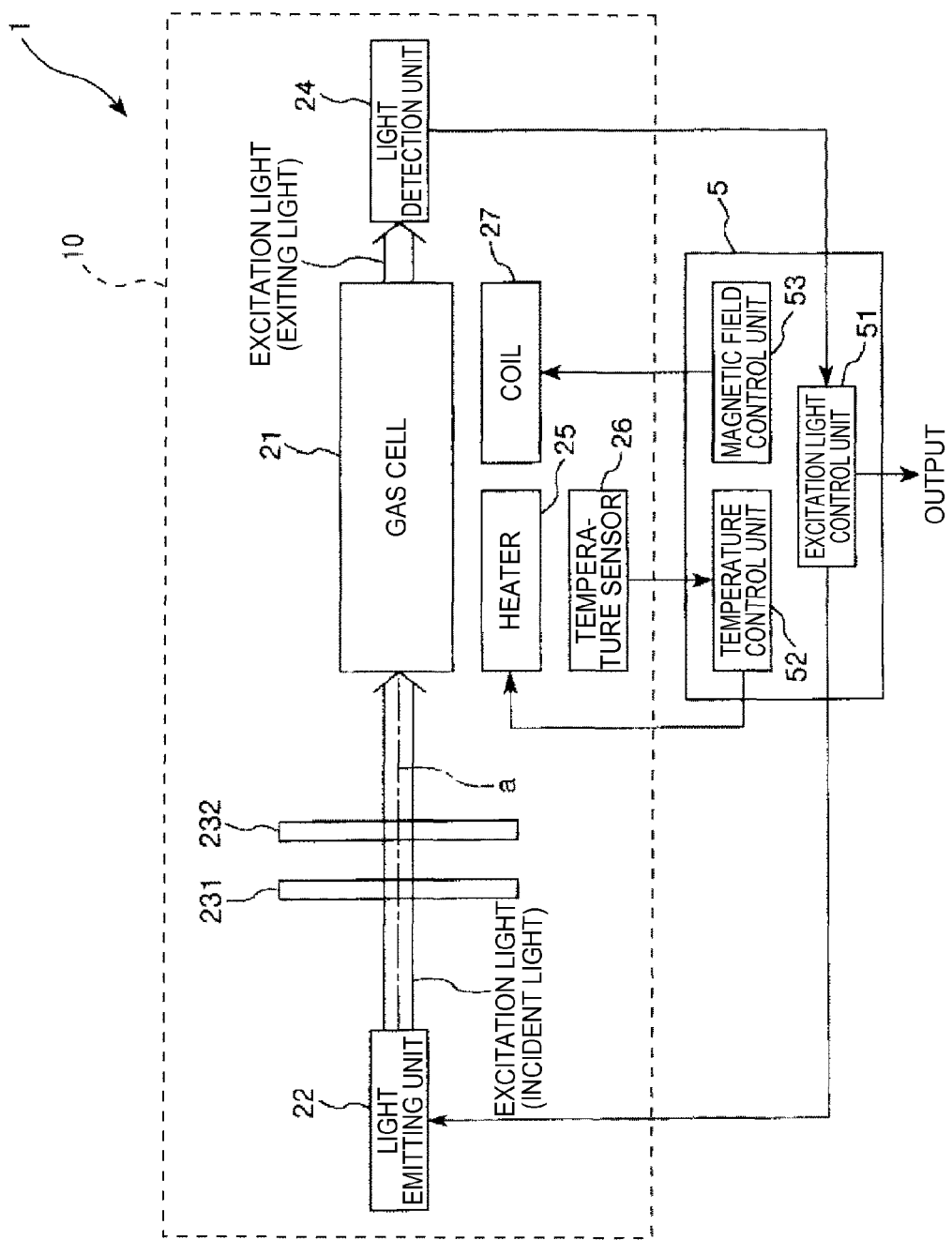
FIG. 1 is a schematic view showing an atomic oscillator (quantum interference device) according an embodiment of the invention.
Figure 2:
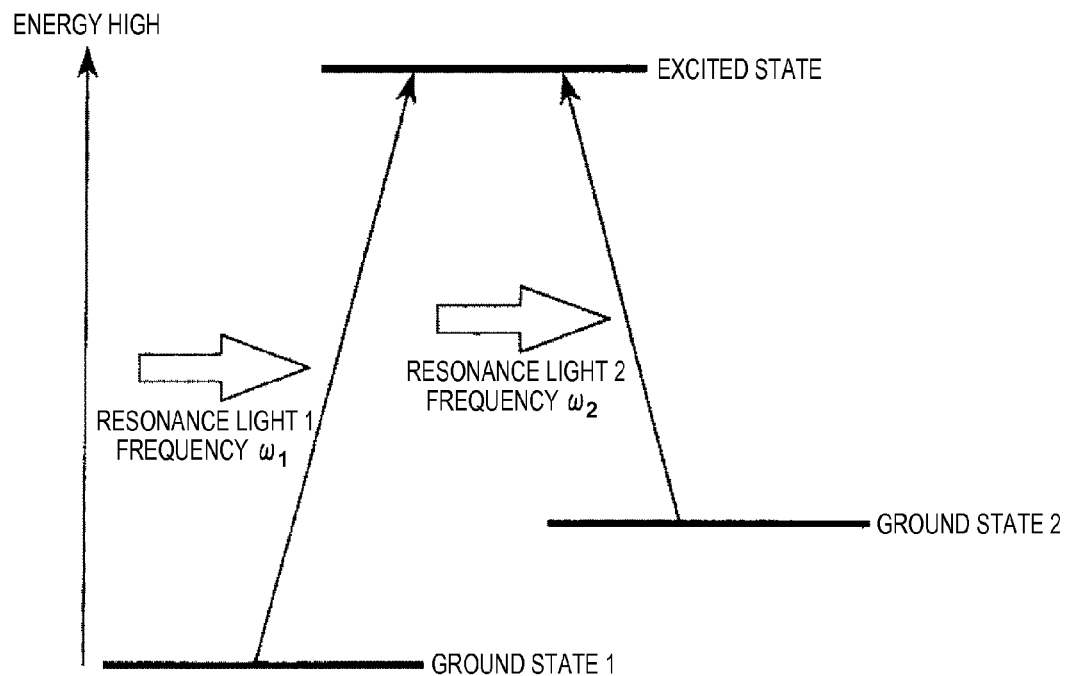
FIG. 2 illustrates the energy states of an alkali metal.
Figure 3:
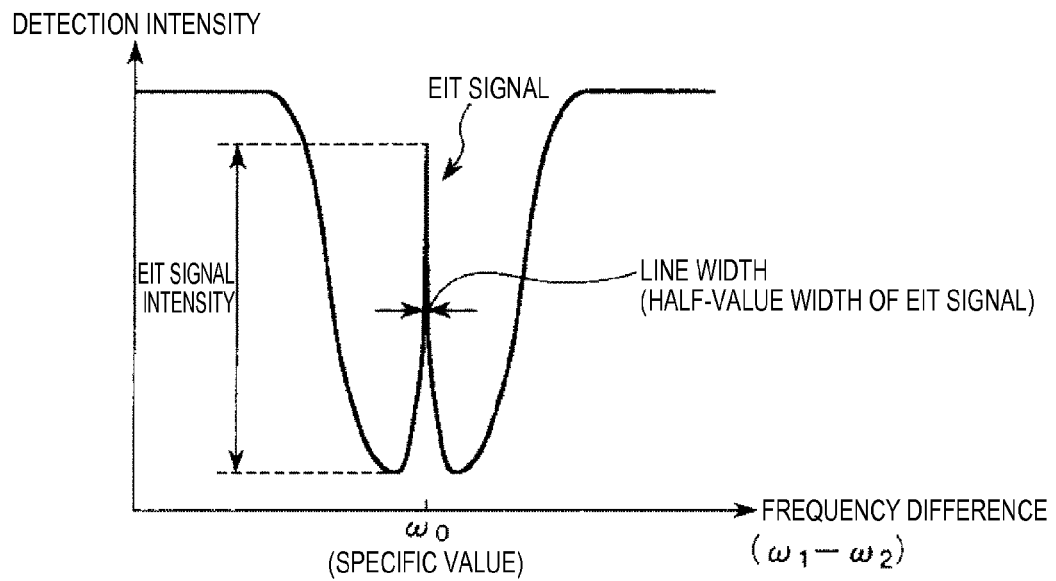
FIG. 3 is a graph showing the relation between the frequency difference between two lights from a light emitting unit and the detection intensity at a light detection unit.

FIG. 1 is a schematic view showing an atomic oscillator (quantum interference device) according to an embodiment of the invention. FIG. 2 illustrates the energy states of an alkali metal. FIG. 3 is a graph showing the relation between the frequency difference between two lights from a light emitting unit and the detection intensity at a light detection unit.

An atomic oscillator 1 shown in FIG. 1 is an atomic oscillator utilizing a quantum interference effect.

This atomic oscillator 1 includes a quantum interference unit 10 and a control unit 5 which controls each part of the quantum interference unit 10, as shown in FIG. 1. Here, the quantum interference unit 10 includes a gas cell 21, a light emitting unit 22, optical components 231, 232, a light detection unit 24, a heater 25 (heating unit), a temperature sensor 26, and a coil 27.

First, the principle of the atomic oscillator 1 will be briefly described.

As shown in FIG. 1, in the atomic oscillator 1, the light emitting unit 22 emits an excitation light LL toward the gas cell 21, and the light detection unit 24 detects the excitation light LL transmitted through the gas cell 21.

A gaseous alkali metal (metal atoms) is enclosed in the gas cell 21. The alkali metal has energy levels of a three-level system and can take three states with different energy levels, that is, two ground states and (ground states 1, 2) and an excited state, as shown in FIG. 2. Here, the ground state 1 is a state with lower energy than the ground state 2.

The excitation light LL emitted from the light emitting unit 22 includes two resonance lights 1, 2 with different frequencies. When these two resonance lights 1, 2 are cast on the gaseous alkali metal as described above, the light absorptance (light transmittance) of the alkali metal with respect to the resonance lights 1, 2 changes according to the difference ($\omega_1 - \omega_2$) between a frequency $\omega_1$ of the resonance light 1 and a frequency $\omega_2$ of the resonance light 2.

When the difference ($\omega_1 - \omega_2$) between the frequency $\omega_1$ of the resonance light 1 and the frequency $\omega_2$ of the resonance light 2 coincides with a frequency equivalent to the energy difference between the ground state 1 and the ground state 2, excitation to the excited state from each of the ground states 1, 2 is stopped. At this point, both of the resonance lights 1, 2 are transmitted through the alkali metal without being absorbed therein. Such a phenomenon is called a CPT phenomenon or EIT (electromagnetically induced transparency).

For example, if the light emitting unit 22 fixes the frequency $\omega_1$ of the resonance light 1 and changes the frequency $\omega_2$ of the resonance light 2, when the difference ($\omega_1 - \omega_2$) between the frequency $\omega_1$ of the resonance light 1 and the frequency $\omega_2$ of the resonance light 2 coincides with a frequency) $\omega_0$ equivalent to the energy difference between the ground state 1 and the ground state 2, the detection intensity at the light detection unit 24 steeply rises with the above EIT phenomenon, as shown in FIG. 3. Such a steep signal is detected as an EIT signal. This EIT signal has a unique value that is dictated by the type of alkali metal. Therefore, an oscillator can be configured using such an EIT signal.

The specific configuration of the atomic oscillator 1 according to this embodiment will be described below.

Figure 4:
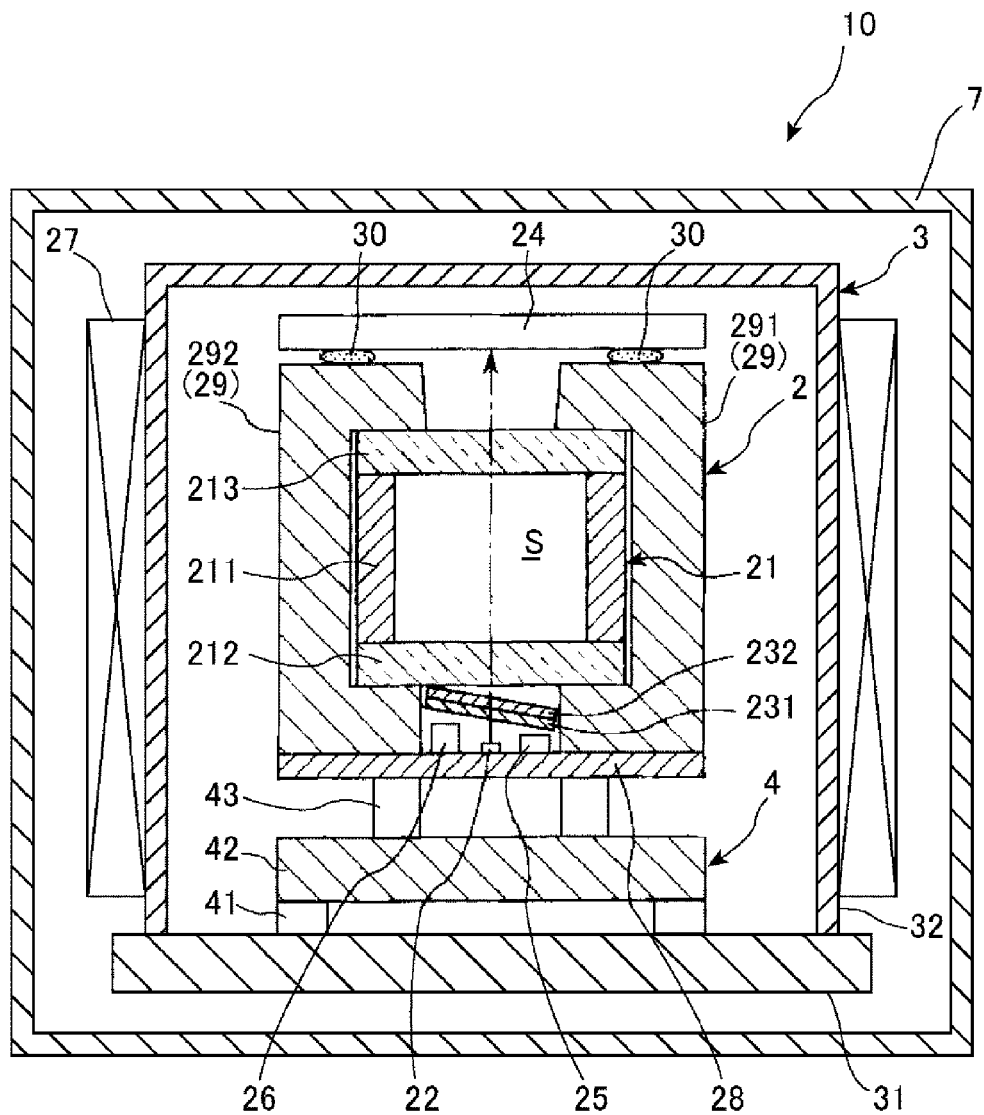
FIG. 4 is a cross-sectional view showing the structure of a quantum interference unit provided in the atomic oscillator shown in FIG. 1.
Figure 5:
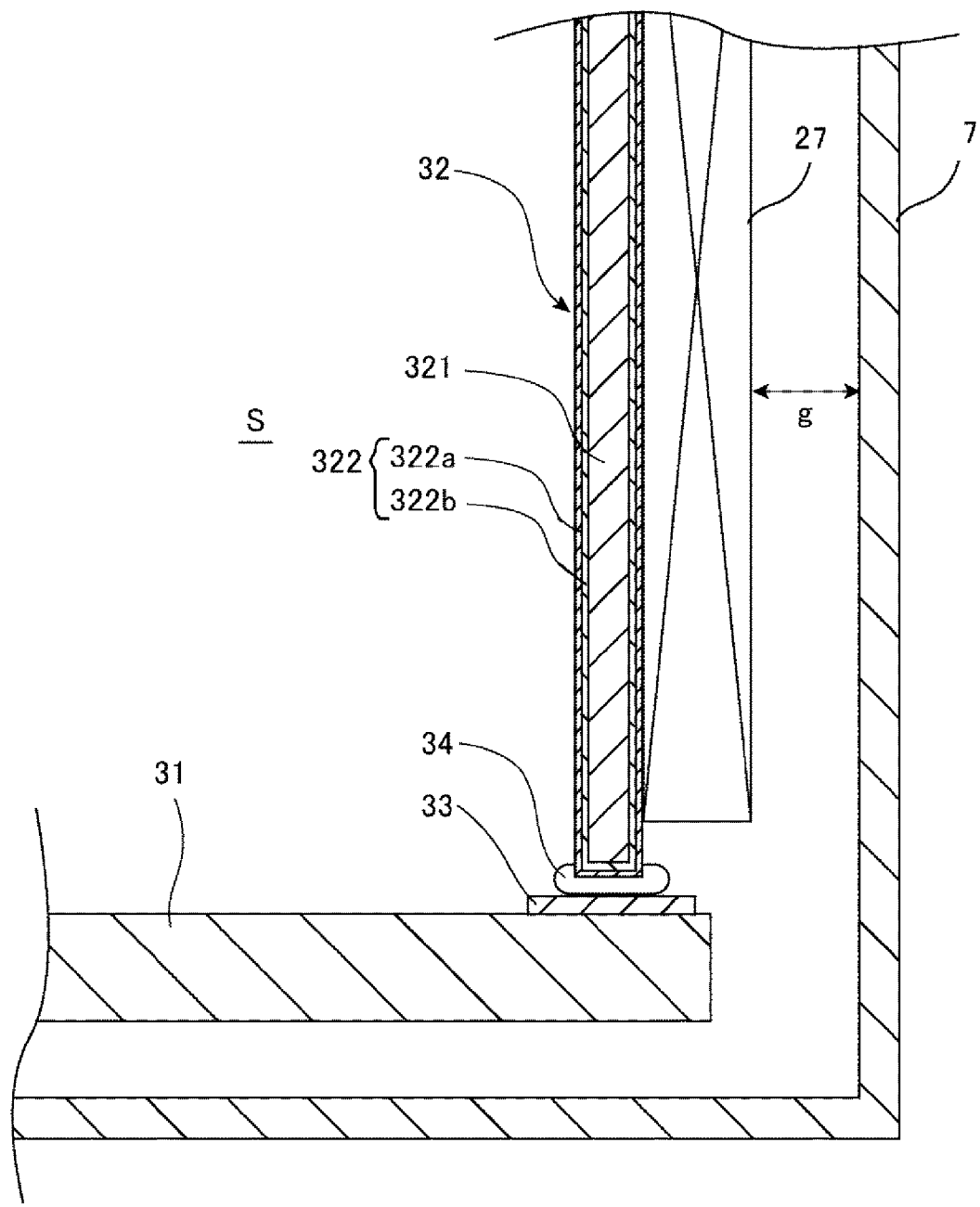
FIG. 5 is a partly enlarged cross-sectional view illustrating a package, a coil, and a magnetic shield provided in the quantum interference unit shown in FIG. 4.

FIG. 4 is a cross-sectional view showing the structure of a quantum interference unit provided in the atomic oscillator shown in FIG. 1. FIG. 5 is a partly enlarged cross-sectional view illustrating a package, a coil, and a magnetic shield provided in the quantum interference unit shown in FIG. 4.

Hereinafter, the top side in FIGS. 4 and 5 is referred to as "top" and the bottom side is referred to as "bottom", as a matter of convenience.

The quantum interference unit 10 includes a main unit 2 which generates the quantum interference effect as described above, a package 3 housing the main unit 2, a support member 4 (support unit) which is housed in the package 3 and supports the main unit 2 to the package 3, the coil 27 provided on the outside of the package 3, and a magnetic shield 7 housing the package 3 and the coil 27, as shown in FIG. 4.

Here, the main unit 2 includes the gas cell 21, the light emitting unit 22, the optical components 231, 232, the light detection unit 24, the heater 25 (temperature adjustment element), the temperature sensor 26, a substrate 28, and a connection member 29, and these are formed as units. Specifically, the light emitting unit 22, the heater 25, the temperature sensor 26, and the connection member 29 are installed on the top surface of the substrate 28. The gas cell and the optical components 231, 232 are held by the connection member 29. The light detection unit 24 is bonded to the connection member 29 via an adhesive 30.

Each part of the atomic oscillator 1 will be described hereinafter.

Gas Cell

A gaseous alkali metal such as rubidium, cesium or sodium is enclosed in the gas cell 21. Also, a rare gas such as argon or neon, and an inert gas such as nitrogen may be enclosed as a buffer gas in the gas cell 21 with the alkali metal gas, if desired.

As shown in FIG. 4, the gas cell 21 has a main body section 211 having a columnar penetration hole, and a pair of window sections 212, 213 blocking both openings of the penetration hole. This forms an internal space S in which the alkali metal as described above is enclosed.

Here, the respective window sections 212, 213 of the gas cell 21 are transmissive of the excitation light from the light emitting unit 22. The one window section 212 is to transmit the excitation light that becomes incident inside the gas cell 21. The other window section 213 is to transmit the excitation light that is emitted from inside the gas cell 21.

The material forming the window sections 212, 213 is not particularly limited as long as transmittance of the excitation light is secured. For example, a glass material, quartz crystal or the like may be used.

The material forming the main body section 211 of the gas cell 21 is not particularly limited and may be a silicon material, ceramic material, metal material, resin material or the like. A glass material, quartz material or the like may also be used, as in the window sections 212, 213.

The window sections 212, 213 are bonded airtightly to the main body section 211. Thus, the internal space S in the gas cell 21 can be formed as an airtight space.

The method for bonding the main body section 211 and the window sections 212, 213 of the gas cell 21 is selected according to the materials forming these sections and is not particularly limited. For example, a bonding method with an adhesive, direct bonding method, anodic bonding method or the like can be used.

Light Emitting Unit

The light emitting unit 22 has the function of emitting the excitation light LL which excites the alkali metal atoms in the gas cell 21.

More specifically, the light emitting unit 22 is configured to emit the two lights (resonance light 1 and resonance light 2) with different frequencies as described above.

The frequency $\omega_1$ of the resonance light 1 can excite (resonate) the alkali metal in the gas cell 21 from the ground state 1 to the excited state.

The frequency $\omega_2$ of the resonance light 2 can excite (resonate) the alkali metal in the gas cell 21 from the ground state 2 to the excited state.

The light emitting unit 22 is not particularly limited as long as the unit can emit the excitation light as described above.

For example, a semiconductor laser such as a vertical resonator surface-emitting laser (VCSEL), or the like can be used.

Optical Components

As shown in FIG. 4, each one of the plurality of optical components 231, 232 is provided on the optical path of the excitation light between the light emitting unit 22 and the gas cell 21.

In this embodiment, the optical component 231 and the optical component 232 are arranged in this order from the side of the light emitting unit 22 toward the gas cell 21.

The optical component 231 is a quarter-wave (λ/4) plate. This can convert the excitation light LL from the light emitting unit 22, from a linearly polarized light to a circularly polarized light (right circularly polarized light or left circularly polarized light).

In the state where the alkali metal atoms in the gas cell 21 are Zeeman-split by the magnetic field of the coil 27 as described below, if a linearly polarized excitation light is cast on the alkali metal atoms, the interaction between the excitation light and the alkali metal atoms causes the alkali metal atoms to be dispersed uniformly to a plurality of levels generated by Zeeman splitting. Consequently, the number of the alkali metal atoms at a desired energy level decreases relatively to the numbers of the alkali metal atoms at other energy levels. Therefore, the number of atoms that manifest a desired EIT phenomenon decreases and the intensity of the desired EIT signal falls. This causes a decline in the oscillation characteristic of the atomic oscillator 1.

In contrast, in the state where the alkali metal atoms in the gas cell 21 are Zeeman-split by the magnetic field of the coil 27 as described below, if a circularly polarized excitation light is cast on the alkali metal atoms, the interaction between the excitation light and the alkali metal atoms enables an increase in the number of the alkali metal atoms at a desired energy level, relative to the numbers of the alkali metal atoms at other energy levels, of a plurality of levels generated by Zeeman splitting of the alkali metal atoms. Therefore, the number of atoms that manifest a desired EIT phenomenon increases and the intensity of the desired EIT signal rises. This enables improvement in the oscillation characteristic of the atomic oscillator 1.

The optical component 232 is a neutral density filter (ND filter) that can adjust (lower) the intensity of the excitation light LL incident on the gas cell 21. Therefore, even if the output of the light emitting unit 22 is high, the excitation light incident on the gas cell 21 can be adjusted to a desired amount of light. In this embodiment, the intensity of the excitation light LL passed through the optical component 231 and polarized in a predetermined direction is adjusted by the optical component 232.

Also, optical components other than the wave plate and the neutral density filter, such as a lens and polarizer, may be arranged between the light emitting unit 22 and the gas cell 21. Depending on the intensity of the excitation light from the light emitting unit 22, the optical component 232 can be omitted.

Light Detection Unit

The light detection unit 24 has the function of detecting the intensity of the excitation light LL (resonance lights 1, 2) transmitted through the gas cell 21.

The light detection unit 24 is not particularly limited as long as the unit can detect the excitation light LL as described above. For example, a photodetector (light receiving element) such as a solar cell or photodiode can be used.

Heater

The heater 25 has a heating resistor (heating unit) which generates heat when electrified. The heater 25 is a "temperature adjustment element" which adjusts the temperature of the gas cell 21.

In this embodiment, the heater 25 is provided on the substrate 28, as described above. The heat from the heater 25 is transferred to the gas cell 21 via the substrate 28 and the connection member 29. Thus, the gas cell 21 (more specifically, the alkali metal atoms in the gas cell 21) is heated and the alkali metal atoms in the gas cell 21 can be maintained in a gaseous state with a desired density. In this embodiment, the heat from the heater 25 is also transferred to the light emitting unit 22 via the substrate 28.

The heater 25 is spaced apart from the gas cell 21. Therefore, adverse effects of an unwanted magnetic field generated by the electrification of the heater 25 on the metal atoms in the gas cell 21 can be restrained.

Temperature Sensor

The temperature sensor 26 is configured to detect the temperature of the heater 25 or the gas cell 21. Based on the result of the detection by the temperature sensor 26, the amount of heat generated by the heater 25 is controlled. Thus, the alkali metal atoms in the gas cell 21 can be maintained at a desired temperature.

In this embodiment, the temperature sensor 26 is provided on the substrate 28. Therefore, the temperature sensor 26 detects the temperature of the heater 25 via the substrate 28. Alternatively, the temperature sensor 26 detects the temperature of the gas cell 21 via the substrate 28 and the connection member 29.

The installation position of the temperature sensor 26 is not limited to this and may be, for example, on the connection member 29, on the heater 25, or on the outer surface of the gas cell 21.

The temperature sensor 26 is not particularly limited, and various known temperature sensors such as a thermistor or thermocouple can be used.

Coil

The coil 27 has the function of generating a magnetic field when electrified. Therefore, as the magnetic field is applied to the alkali metal atoms in the gas cell 21, the degenerated gap between difference energy levels of the alkali metal can be expanded by Zeeman splitting, thus improving resolution. Consequently, the accuracy of the oscillation frequency of the atomic oscillator 1 can be enhanced.

In this embodiment, the coil 27 is a solenoid coil. The coil 27 may be a Helmholtz coil.

Here, the coil 27 is arranged on the outside of the package 3, as described above. Since the package 3 is formed with a non-magnetic material as a principal material, as described below, the magnetic field from the coil 27 can act on the inside of the package 3 even though the coil 27 is arranged on the outside of the package 3. Also, since the coil 27 is arranged on the outside of the package 3, the volume inside the package 3 can be reduced. Consequently, miniaturization of the quantum interference unit 10 can be achieved. Moreover, as the volume inside the package 3 is reduced, reliability at the time of vacuum-sealing the inside of the package 3 can be increased. In this embodiment, the coil 27 is in contact with or close to the outer peripheral surface of the package 3. The coil 27 can be fixed to the package 3 with an adhesive if desired.

The magnetic field generated by the coil 27 may be one of a DC magnetic field and an AC magnetic field, or may be a DC magnetic field and an AC magnetic field superimposed on each other.

Connection Member

The connection member 29 thermally connects the heater 25 and the respective window sections 212, 213 of the gas cell 21. Thus, the heat from the heater 25 can be transferred to the respective window sections 212, 213 via heat conduction by the connection member 29 and can heat the respective window sections 212, 213. Also, the heater 25 and the gas cell 21 can be spaced apart from each other. Therefore, adverse effects of an unwanted magnetic field generated by electrification of the heater 25 on the alkali metal atoms in the gas cell 21 can be restrained. Moreover, since the number of the heaters 25 can be reduced, for example, the number of wires for electrification of the heater 25 can be reduced, thus achieving miniaturization of atomic oscillator 1 (quantum interference device).

As shown in FIG. 4, the connection member 29 is formed by a pair of connection members 291, 292 provided on both sides of the gas cell 21. This facilitates the installation of the connection member 29 with respect to the gas cell 21 and enables uniform heat transfer from the connection member 29 to the respective window sections 212, 213 of the gas cell 21.

The pair of connection members 291, 292 is fitted, for example, to sandwich the gas cell 21 from both sides of a pair of lateral sides opposite each other of the gas cell 21. The window sections 212, 213 and the connection members 291, 292 contact each other and are thermally connected together. The connection members 291, 292 are formed, each avoiding the passing area of the excitation light LL.

A gap may be formed at least either between the connection members 291, 292 and the window section 212 or between the connection members 291, 292 and the window section 213. In such a case, it is preferable that the gap is filled with a thermally conductive adhesive. Thus, the window sections 212, 213 and the connection members 291, 292 can be thermally connected together. Such an adhesive may be, for example, a resin-based adhesive, a silicone resin-based adhesive or the like containing a metal paste or thermally conductive filler.

The connection members 291, 292 are each arranged with a gap from the main body section 211 of the gas cell 21. Thus, heat transfer between the connection members 291, 292 and the main body section 211 of the gas cell 21 can be restrained and heat transfer from the connection members 291, 292 to the respective window sections 212, 213 can be carried out efficiently.

The material forming the connection member 29 may be any material having a higher thermal conductivity than the material forming the gas cell 21. However, a material with excellent thermal conductivity, for example, a metal material is preferable. Also, as in the package 3 described below, a non-magnetic material is preferable as the material forming the connection member 29 so as not to obstruct the magnetic field from the coil 27.

Substrate

The substrate 28 has the function of supporting the heater 25, the temperature sensor 26 and the connection member 29 or the like. The substrate 28 also has the function of transferring the heat from the heater 25 to the connection member 29. Thus, even though the heater 25 is spaced apart from the connection member 29, the heat from the heater 25 can be transferred to the connection member 29.

Here, the substrate 28 thermally connects the heater 25 and the connection member 29. Installing the heater 25 and the connection member 29 on the substrate 28 in this manner enables increase in the degree of freedom in the installation of the heater 25.

Also, since the light emitting unit 22 is installed on the substrate 28, the temperature of the light emitting unit 22 on the substrate 28 can be adjusted with the heat from the heater 25.

The substrate 28 also has wires (not shown) which are electrically connected to the light emitting unit 22, the heater 25 and the temperature sensor 26.

The material forming the substrate 28 is not particularly limited. For example, a ceramic material, metal material or the like can be used. One kind of such materials can be used singly, or two kinds or more can be used in combination. If the surface of the substrate 28 is formed with a metal material, heat reflectance on the surface of the substrate 28 can be enhanced and heat radiation from the substrate 28 can be restrained. Also, if the substrate 28 is formed with a metal material, an insulation layer formed with, for example, a resin material, metal oxide, metal nitride or the like, may be provided on the surface of the substrate 28 if desired, for the purpose of preventing a short circuit of the wires in the substrate 28.

As in the package 3 described below, a non-magnetic material is preferable as the material forming the substrate 28 so as not to obstruct the magnetic field from the coil 27.

The substrate 28 can be omitted, depending on the shape of the connection member 29 and the installation position of the heater 25 or the like. In such a case, the heater 25 can be installed at a position in contact with the connection member 29.

Support Member

The support member 4 (support unit) is housed in the package 3 and has the function of supporting the main unit 2 to the package 3. That is, the support member 4 supports each part of the main unit 2 directly or indirectly to the package 3.

The support member 4 also has the function of restraining heat transfer between the main unit 2 and the outside of the package 3. Thus, heat interference between each part of the main unit 2 and the outside can be restrained.

The support member 4 has a plurality of leg sections 41 (column sections), a connecting section 42 connecting the plurality of leg sections 41, and a plurality of column sections 43 provided on the side of opposite to the leg sections 41, of the connecting section 42, as shown in FIG. 4.

The plurality of leg sections 41 is each bonded to the inner surface of a base 31 of the package 3 described later, for example, with an adhesive.

Each leg section 41 is provided upright, extending in a vertical direction on the inner surface of the base 31.

The connecting section 42 connects the upper ends (other ends) of the plurality of leg sections 41 to each other. This increases the rigidity of the support member 4.

The connecting section 42 is plate-shaped as a whole. This can increase the rigidity of the support member 4 with a relatively simple configuration.

The plurality of column sections 43 connects the connecting section 42 and the main unit 2 (more specifically, the substrate 28). Thus, the main unit 2 is supported by the support member 4. Also, the plurality of column sections 43 is arranged at a different position from the plurality of leg sections 41, as in a plan view seen from the direction of the thickness of the connecting section 42. This can increase the length of the heat transfer path from the main unit 2 to the package 3 via the support member 4.

In this embodiment, the leg sections 41, the connecting section 42 and the column sections 43 are formed as a unified body. However, these components may be formed as separate members and bonded together, for example, with an adhesive.

In the support member 4, a gap is formed between the connecting section 42 and the main unit 2. This can reduce the contact area between the main unit 2 and the connecting section 42 and effectively restrain heat transfer between the connecting section 42 and the main unit 2.

It is preferable that the support member 4 is formed with a porous body. This can enhance the insulation property (heat resistance) of the support member 4. Therefore, heat escape to the base 31 from the gas cell 21 and the heater 25 by heat transfer through the support member 4 can be restrained and consequently reduction in power consumption in the atomic oscillator 1 can be achieved.

The material forming the support member 4 is not particularly limited, as long as the material has relatively low thermal conductivity and can secure rigidity of the support member 4 to support the main unit 2. For example, a non-metal material such as a resin material or ceramic material is preferable. A resin material is more preferable. If the support member 4 is formed mainly with a resin material, heat resistance of the support member 4 can be increased, and even if the support member 4 has a complex shape, the support member 4 can be manufactured easily using a known method, for example, injection molding or the like. Particularly, if the support member 4 is formed mainly with a resin material, the support member 4 formed with a foam can be formed easily.

As in the package 3 described below, a non-magnetic material is preferable as the material forming the support member 4 so as not to obstruct the magnetic field from the coil 27.

Package

As shown in FIG. 4, the package 3 has the function of housing the main unit 2 and the support member 4. Also, components other than the above components may be housed in the package 3.

The package 3 includes the base 31 (base section) in the shape of a plate and a lid 32 in a cylindrical shape with a closed bottom, as shown in FIG. 4. The opening of the lid 32 is closed by the base 31. This forms the space for housing the main unit 2 and the support member 4. Here, the lid 32 is spaced apart from the main unit 2 and the support member 4. That is, there is a space between the lid 32, and the main unit 2 and the support member 4. Thus, this space functions as an insulating layer, enabling reduction in heat interference between the main unit 2 and the outside of the package 3.

The base 31 supports the main unit 2 via the support member 4.

The base 31 is a wiring board. Although not shown, a plurality of wires and a plurality of terminals for electrifying the inside and outside of the package 3 are provided on the base 31. The light emitting unit 22 and the substrate 28 are electrically connected respectively to the base 31 via a wire, not shown (for example, a flexible wiring board or bonding wire or the like).

The lid 32 is joined to the base 31 with a brazing material 34. In this embodiment, a metalized layer 33 is provided on the top surface of the base 31, and the metalized layer 33 and the lid 32 are joined together with the brazing material 34. Thus, the lid 32 and the brazing material 34 formed with a metal material can be airtightly joined together easily and securely even if the base 31 is formed with a ceramic.

The material forming the metalized layer 33 is not particularly limited. For example, metal materials such as gold (Au), gold alloy, platinum (Pt), aluminum (Al), aluminum alloy, silver (Ag), silver alloy, chromium (Cr), chromium alloy, nickel (Ni), copper (Cu), molybdenum (Mo), niobium (Nb), tungsten (W), iron (Fe), titanium (Ti), cobalt (Co), zinc (Zn), and zirconium (Zr) can be used. In this embodiment, the metalized layer 33 is provided only on an outer peripheral part of the top surface of the base 31. However, the metalized layer 33 may be provided over the entire top surface of the base 31. In such a case, the heat from the main unit 2 can be reflected to reduce the heat that escapes out of the package 3.

Since the package 3 is thus sealed using the brazing material 34, the package 3 can be airtightly sealed at a relatively low temperature. Therefore, even if the package 3 contains a material that can change into a magnetic material at a high temperature, such change can be prevented. For example, nickel with phosphorus added at a high concentration (8% or higher) is normally non-magnetic. However, when heated at 300 to 350° C., this nickel becomes magnetic. Therefore, in the case where such a metal material is used for the base 31 and the lid 32, the resulting package 3 can be made non-magnetic by sealing at a lower temperature than the temperature at which such change occurs.

In view of this, the melting point of the brazing material 34 may be preferably below 300° C., more preferably 150° C. or above to 280° C. or below, and still more preferably 200° C. or above to 250° C. or below. Thus, even if the package 3 contains phosphorus-added nickel as a material that can change into a magnetic material at a high temperature, such change can be prevented.

The brazing material 34 is not particularly limited as long as the material has a relatively low melting point as described above. For example, it is preferable that the brazing material 34 is formed with an alloy containing gold and tin, such as an Au—Sn alloy containing Sn by 90% (melting point 217° C.). Thus, the brazing material 34 can have a melting point below 300° C. Alternatively, a solder of a Sn—Pd alloy, Sn—Ag—Cu alloy or the like can be used.

It is preferable that the inside of the package 3 is an airtight space with a lower pressure than atmospheric pressure. This enables reduction in heat interference between the inside and outside of the package 3. Consequently, further miniaturization and power saving of the quantum interference unit 10 can be achieved.

The base 31 and the lid 32 are each formed mainly with a non-magnetic material. This enables prevention of or reduction in change in characteristics caused by a magnetic field due to magnetization of the package 3. Also, even if the coil 27 is arranged on the outside of the package 3 as described above, the magnetic field from the coil 27 can be allowed to act on the metal atoms in the gas cell 21.

Specifically, the material forming the base 31 is not particularly limited as long as the material is non-magnetic. For example, a metal material, resin material, ceramic material or the like can be used. However, it is preferable to use a non-magnetic ceramic material. Thus, the magnetic field from the coil 27 is transmitted and the heat insulation property of the base 31 is enhanced, enabling further reduction in power consumption in the atomic oscillator 1. Since ceramic materials generally have a high insulation property, wires can be provided directly on the base 31 formed with a ceramic, and excellent airtightness is achieved. Therefore, the reliability of the quantum interference unit 10 can be increased. Also, using a metal material as the material forming the base 31 can have the same effects as in the lid 32 described below. In this case, insulation processing such as providing an insulating film may be carried out if desired.

In this embodiment, the lid 32 includes a non-magnetic metal layer 321 and a coating layer 322 provided on the surface of the metal layer 321.

The metal layer 321 is the base member of the lid and formed with a non-magnetic metal material. The non-magnetic metal material is not particularly limited and may be, for example, Cu (copper), SUS 304, Al (aluminum), Ti (titanium), Mg (magnesium), Hastelloy or the like. Among these, Cu or SUS 304 is preferable as the non-magnetic metal material forming the metal layer 321 in view of workability, contactability with the coating layer 322, availability of the material, or the like. In this description, the term "non-magnetic" refers to having a relative permeability of 1.02 or below.

The method for forming the metal layer 321 is not particularly limited. For example, press molding or the like can be used. Press molding may be carried out after a layer to be the coating layer 322 is formed or before the coating layer 322 is formed.

The coating layer 322 is formed with a different metal material from the metal layer 321. Thus, when the package 3 is sealed with the brazing material 34, even if the metal layer 321 has poor wettability to the brazing material 34, the coating layer 322 has excellent wettability to the brazing material 34, enabling easy and secure airtight sealing.

In this embodiment, the coating layer 322 includes a surface layer 322a and an underlying layer 322b. The surface layer 322a has the function of enhancing wettability to the brazing material 34 at the time of sealing and contactability to the brazing material 34 after sealing. The surface layer 322a also has the function of reflecting the radiation heat from the main unit 2. Meanwhile, the underlying layer 322b has the function of enhancing the contactability of the surface layer 322a to the metal layer 321.

The coating layer 322 is provided over the entire surface including the inner surface, the outer surface and the bottom end surface of the metal layer 321. In order to achieve the above functions, the coating layer 322 only needs to be provided at the joining part between the lid 32 and the base 31 with the brazing material 34, and there may be a part where the coating layer 322 is not formed on the inner surface or the outer surface of the lid 32.

The coating layer 322 is thinner than the metal layer 321. Thus, necessary properties such as mechanical strengths for the package 3 can be secured by the metal layer 321, while desired properties can be provided for the surface of the package 3 by the coating layer 322 in a relatively simple manner.

As the materials forming the surface layer 322a and the underlying layer 322b, metal materials are used for both. Non-magnetic metal materials are preferable. Specifically, as the material forming the surface layer 322a, Au (gold) is preferable in view of securing the above functions and non-magnetic property. As the material forming the underlying layer 322b, phosphorus-added Ni (phosphorus concentration of 8% or above, preferably 10% or above), or Pd (palladium) is preferable in view of securing the above functions and non-magnetic property. That is, it is preferable that the underlying layer 322b contains phosphorus or palladium.

Since both of the surface layer 322a and the underlying layer 322b are thus formed with non-magnetic metals, that is, since the coating layer 322 is formed with non-magnetic metals, change in characteristics due to magnetization of the coating layer 322 can be reduced. Also, since gold has a high radiation heat reflectance, forming the surface layer 322a (inner surface of the package 3) with gold enables reflection of the heat from the main unit 2 and reduction of the heat escaping out of the package 3. Consequently, power saving can be achieved effectively.

At least one of the surface layer 322a and the underlying layer 322b may be formed with a magnetic metal material. Even in this case, reducing the thickness of the layer (specifically 5 μm or less) enables reduction in the deterioration of characteristics due to magnetization of the layer. In this case, as the material forming the underlying layer 322b, Ni (nickel), phosphorus-added Ni (phosphorus concentration below 8%), or boron-added Ni or the like can be used in view of securing the above functions.

The method for forming each of the surface layer 322a and the underlying layer 322b is not particularly limited. For example, a chemical vapor deposition method (CVD) such as plasma CVD or thermal CVD, a dry plating method such as vacuum evaporation, a sol-gel method, an electroplating method, an electroless plating method or the like can be used to form these layers.

The coating layer 322 may also be formed as a single layer. For example, one of the surface layer 322a and the underlying layer 322b may be omitted. If the coating layer 322 is formed with a non-magnetic metal material, it can be said that the coating layer 322 forms a "metal layer" and it can also be said that the multilayer body made up of the metal layer 321 and the coating layer 322 form a "metal layer". The coating layer 322 may be omitted, depending on the material forming the metal layer 321 and the material forming the brazing material 34 or the like.

Magnetic Shield

The magnetic shield 7 has a magnetic shielding property and houses the package 3 and the coil 27. That is, the magnetic shield 7 is arranged on the outside of the package 3, and the coil 27 is arranged between the package 3 and the magnetic shield 7. Thus, the influence of a magnetic field from outside on the gas cell 21 can be reduced. Consequently, the characteristics of the quantum interference unit 10 can be stabilized.

The magnetic shield 7 is spaced apart from the coil 27 by a distance g.

As the material forming the magnetic shield 7, a material with high magnetic permeability of 100 $N/A^2$ or above is preferable. Specifically, a soft magnetic material such as Fe or various iron-based alloys (ferrosilicon, permalloy, amorphous, sendust, kovar) is preferable. An iron-based alloy is more preferable. This enables provision of an excellent magnetic shield property of the magnetic shield 7.

The magnetic shield 7 supports the package 3 via a support member, not shown.

Control Unit

The control unit 5 shown in FIG. 1 has the function of controlling each of the heater 25, the coil 27, and the light emitting unit 22.

The control unit 5 includes an excitation light control unit 51 which controls the frequencies of the resonance lights 1, 2 from the light emitting unit 22, a temperature control unit 52 which controls the temperature of the alkali metal in the gas cell 21, and a magnetic field control unit 53 which controls the magnetic field applied to the gas cell 21.

The excitation light control unit 51 controls the frequencies of the resonance lights 1, 2 emitted from the light emitting unit 22 on the basis of the result of the detection by the light detection unit 24. More specifically, the excitation light control unit 51 controls the frequencies of the resonance lights 1, 2 emitted from the light emitting unit 22 in such a way that the frequency difference ($\omega 1 - \omega 2$) equals the frequency $\omega 0$ that is unique to the alkali metal. The excitation light control unit 51 also controls the center frequency of the resonance lights 1, 2 emitted from the light emitting unit 22.

Here, the excitation light control unit 51 has a voltage control-type crystal oscillator (oscillation circuit), though not shown. The excitation light control unit 51 outputs an output signal of the voltage control-type crystal oscillator as an output signal of the atomic oscillator 1 while synchronizing and adjusting the oscillation frequency of the voltage control-type crystal oscillator on the basis of the result of the detection by the light detection unit 24.

For example, the excitation light control unit 51 has a multiplier which performs frequency multiplication of the output signal from the voltage control-type crystal oscillator, though not shown. The excitation light control unit 51 superimposes the signal multiplied by the multiplier (high-frequency signal) on a DC bias current and inputs the resulting signal to the light emitting unit 22 as a drive signal. Thus, as the voltage control-type crystal oscillator is controlled in such a way that the light detection unit 24 detects an EIT signal, a signal with a desired frequency is outputted from the voltage control-type crystal oscillator. The multiplication factor of the multiplier is, for example, $\omega 0/(2 \times f)$, where the desired frequency of the output signal from the atomic oscillator 1 is f. Thus, when the oscillation frequency of the voltage control-type crystal oscillator is f, the light emitting unit 22 formed with a light emitting element such as a semiconductor laser can be modulated using the signal from the multiplier so as to emit two lights such that the frequency difference ($\omega 1 - \omega 2$) is $\omega 0$.

The temperature control unit 52 (e.g., a processor) controls electrification of the heater 25 on the basis of the result of the detection by the temperature sensor 26. Thus, the gas cell 21 can be maintained within a desired temperature range.

The magnetic field control unit 53 (e.g., a processor) controls electrification of the coil 27 in such a way that the magnetic field generated by the coil 27 is constant.

The control unit 5 is provided, for example, on an IC chip mounted on a substrate where the package 3 is mounted. The control unit 5 may be provided inside the package 3 (for example, on the base 31).

According to the atomic oscillator 1 as described above, change in characteristics caused by a magnetic field due to magnetization of the package 3 can be prevented or reduced. Also, since the lid 32 of the package 3 has a low heat absorptance, power saving can be achieved.

2. Electronic Apparatus

The atomic oscillator described above can be incorporated in various electronic apparatuses. An electronic apparatus having an atomic oscillator according to the invention has excellent reliability.

Hereinafter, an example of an electronic apparatus having an atomic oscillator will be described.

Figure 6:
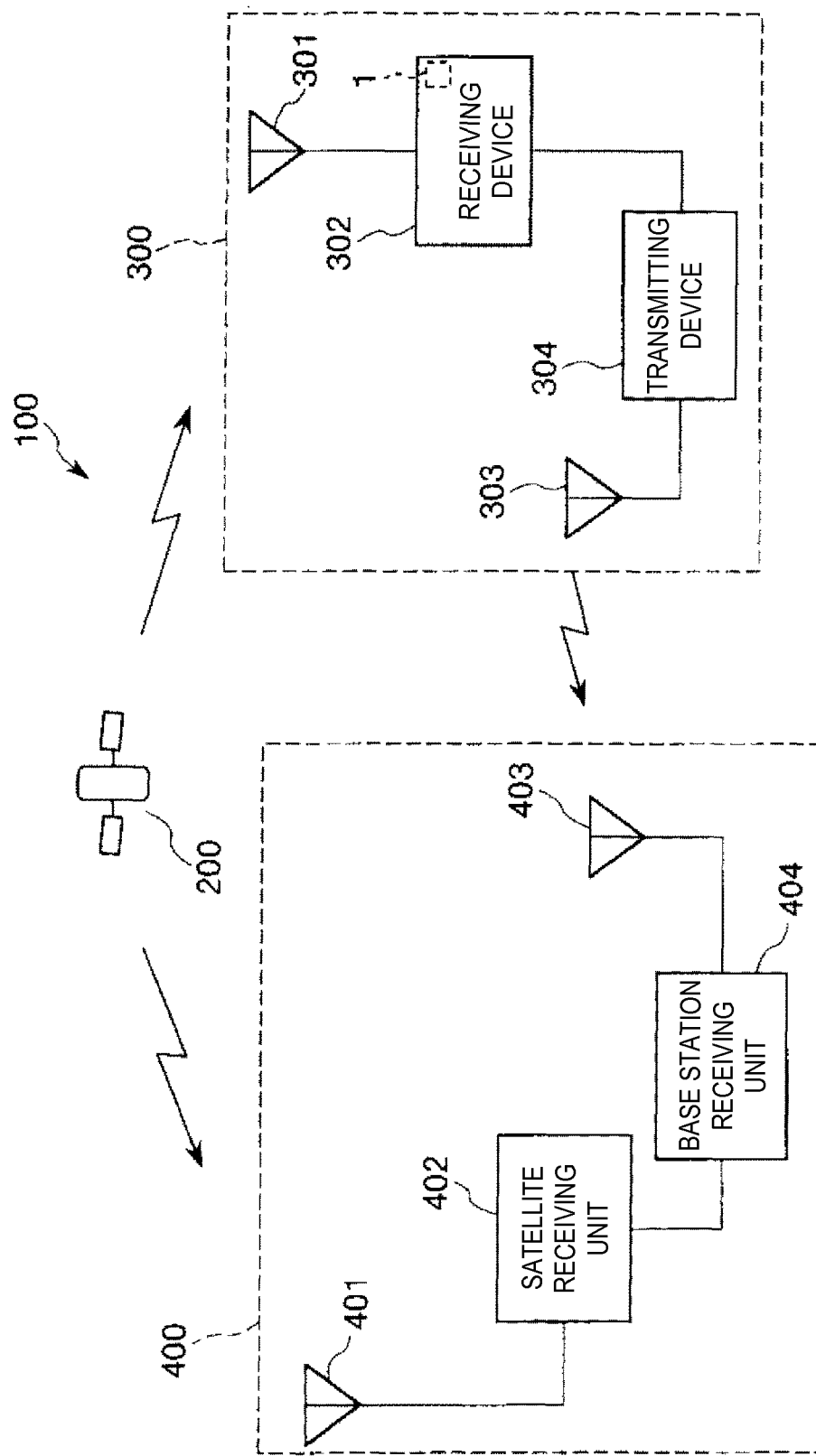
FIG. 6 shows the schematic configuration in the case where the atomic oscillator according to the invention is used for a positioning system utilizing a GPS satellite.

FIG. 6 shows the schematic configuration in the case where an atomic oscillator according to the invention is used for a positioning system utilizing a GPS satellite.

A positioning system 100 shown in FIG. 6 includes a GPS satellite 200, a base station device 300, and a GPS receiving device 400.

The GPS satellite 200 transmits positioning information (GPS signal).

The base station device 300 has a receiving device 302 which receives positioning information from the GPS satellite 200 with high accuracy, for example, via an antenna 301 installed at an electronic reference point (GPS continuous observation station), and a transmitting device 304 which transmits the positioning information received by the receiving device 302, via an antenna 303.

Here, the receiving device 302 is an electronic device having an atomic oscillator according to the invention, as its reference frequency oscillation source. Such a receiving device 302 has excellent reliability. The positioning information received by the receiving device 302 is transmitted by the transmitting device 304 in real time.

The GPS receiving device 400 has a satellite receiving unit 402 which receives positioning information from the GPS satellite 200 via an antenna 401, and a base station receiving unit 404 which receives positioning information from the base station device 300 via an antenna 403.

3. Moving Object

The atomic oscillator described above can also be incorporated in various moving objects. A moving object having an atomic oscillator according to the invention has excellent reliability.

Hereinafter, an example of a moving object according to the invention will be described.

Figure 7:
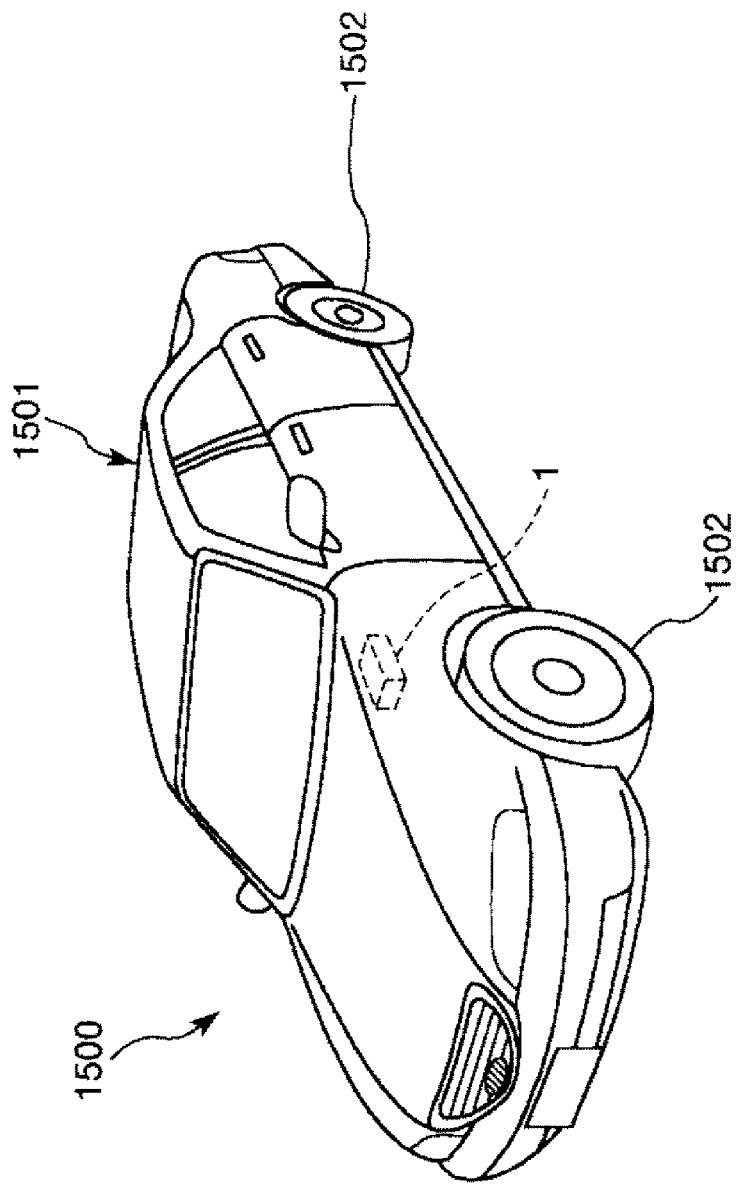
FIG. 7 is a perspective view showing the configuration of a moving object (an automobile) having the atomic oscillator according to the invention.

FIG. 7 is a perspective view showing the configuration of a moving object (automobile) having an atomic oscillator according to the invention.

A moving object 1500 shown in FIG. 7 has a vehicle body 1501 and four wheels 1502 and is configured in such a way that the wheels 1502 are rotated by a power source (engine), not shown, provided in the vehicle body 1501. The atomic oscillator 1 is installed inside the moving object 1500. Based on an oscillation signal from the atomic oscillator 1, for example, a control unit, not shown, controls the driving of the power source.

The electronic apparatus or the moving object according to the invention is not limited to the above examples and can also be applied to, for example, mobile phones, digital still cameras, ink jet ejection devices (for example, ink jet printer), personal computers (mobile personal computers, laptop personal computers), televisions, video cameras, video tape recorders, car navigation systems, pagers, electronic organizers (including those with communication functions), electronic dictionaries, electronic calculators, electronic game machines, word processors, workstations, video phones, surveillance monitor, electronic binoculars, POS terminals, medical apparatuses (for example, digital thermometers, blood pressure gauges, glucose meters, electrocardiogram measurement devices, ultrasonic diagnosis devices, and electronic endoscopes), fishfinders, various measurement apparatuses, instruments (for example, instruments on vehicles, aircraft or shipping craft), flight simulators, ground-wave digital broadcasting, mobile phone base stations, or the like.

The quantum interference unit, the quantum interference device, the atomic oscillator, the electronic apparatus and the moving object according to the invention are described above on the basis of the illustrated embodiments. However, the invention is not limited to these. For example, the configuration of each part of the embodiments can be replaced by an arbitrary configuration that achieves a similar function, or an arbitrary configuration can be added thereto.

The configuration inside the package in the embodiment is simply an example and is not limiting. The configuration of each component inside the package may be changed.

In the embodiment, the case of using a lid including a metal layer with a coating layer formed on its surface is described as an example. However, by using a lid including a non-magnetic ceramic layer with a non-magnetic metal layer formed on its surface, it is also possible to reduce magnetization of the lid and allow the magnetic field from the coil arranged outside the lid to act on the inside of the lid.

The entire disclosure of Japanese Patent Application No. 2014-013818 filed Jan. 28, 2014 is expressly incorporated by reference herein.

What is claimed is:

1. A quantum interference unit comprising:
   a gas cell which houses metal atoms;
   a temperature adjustment element operatively associated with the gas cell to adjust a temperature of the gas cell; and a package housing the gas cell and the temperature adjustment element, the package including a lid formed of a non-magnetic metal layer, wherein the package further includes a coating layer coated over the non-magnetic metal layer, the coating layer being a different material than the non-magnetic metal layer, and the coating layer contains a non-magnetic metal.

2. The quantum interference unit according to claim 1, further comprising a coil which is arranged on an exterior of the package and applies a magnetic field to the metal atoms.

3. The quantum interference unit according to claim 2, further comprising a magnetic shield which houses the package and the coil.

4. The quantum interference unit according to claim 1, wherein an interior of the package is at a negative atmospheric pressure.

5. The quantum interference unit according to claim 4, wherein a brazing material seals the lid of the package to a base.

6. The quantum interference unit according to claim 5, wherein a melting point of the brazing material is below 300° C.

7. The quantum interference unit according to claim 5, wherein the brazing material contains gold and tin.

8. The quantum interference unit according to claim 1, wherein the coating layer contains phosphorus.

9. The quantum interference unit according to claim 8, wherein a content of the phosphorus in the coating layer is 8% by weight or more.

10. The quantum interference unit according to claim 1, wherein the coating layer contains palladium.

11. A quantum interference device comprising:
the quantum interference unit according to claim 1; and
a control unit controlling the quantum interference unit.

12. An atomic oscillator comprising:
the quantum interference unit according to claim 1; and
a control unit controlling the quantum interference unit.

13. An electronic apparatus comprising:
the quantum interference unit according to claim 1; and
a control unit controlling the quantum interference unit.

14. A moving object comprising:
the quantum interference unit according to claim 1; and
a control unit controlling the quantum interference unit.

15. A quantum interference unit comprising:
a gas cell which houses metal atoms;
a temperature adjustment element operatively associated with the gas cell;
a package housing the gas cell and the temperature adjustment element, the package including a base sealed to a lid with a brazing material; and
a coating layer coated over the lid, the coating layer being a different material than the lid,
wherein a non-magnetic metal layer extends along an entirety of the lid, and
the coating layer contains a non-magnetic metal.

16. The quantum interference unit according to claim 15, wherein a melting point of the brazing material is below 300° C.

* * * * *